(12) United States Patent
Kinney et al.

(10) Patent No.: US 9,715,419 B2
(45) Date of Patent: Jul. 25, 2017

(54) SELECTIVE READING OF MEMORY WITH IMPROVED ACCURACY

(71) Applicant: Micron Technology, Inc., Boise, ID (US)

(72) Inventors: Wayne Kinney, Emmett, ID (US); Gurtej S. Sandhu, Boise, ID (US)

(73) Assignee: OVONYX MEMORY TECHNOLOGY, LLC, Alexandria, VA (US)

( * ) Notice: Subject to any disclaimer, the term of this patent is extended or adjusted under 35 U.S.C. 154(b) by 0 days.

(21) Appl. No.: 14/681,471

(22) Filed: Apr. 8, 2015

(65) Prior Publication Data

US 2015/0212871 A1    Jul. 30, 2015

Related U.S. Application Data

(62) Division of application No. 13/804,598, filed on Mar. 14, 2013, now Pat. No. 9,025,364.

(51) Int. Cl.
| | | |
|---|---|---|
| *G11C 11/00* | (2006.01) | |
| *G06F 11/07* | (2006.01) | |
| *G11C 11/16* | (2006.01) | |
| *G11C 29/02* | (2006.01) | |
| *G11C 29/04* | (2006.01) | |

(52) U.S. Cl.
CPC ...... *G06F 11/0751* (2013.01); *G06F 11/0727* (2013.01); *G11C 11/16* (2013.01); *G11C 11/1673* (2013.01); *G11C 11/1677* (2013.01); *G11C 29/021* (2013.01); *G11C 2029/0411* (2013.01)

(58) Field of Classification Search
CPC .. G06F 11/0751; G06F 11/0727; G11C 11/06; G11C 11/1673; G11C 11/1677
USPC .................................................. 365/148, 158
See application file for complete search history.

(56) References Cited

U.S. PATENT DOCUMENTS

| | | | |
|---|---|---|---|
| 6,445,624 | B1 | 9/2002 | Janzen et al. |
| 6,903,989 | B2 | 6/2005 | Jeong |
| 7,272,035 | B1 | 9/2007 | Chen et al. |
| 7,577,018 | B2 | 8/2009 | Kurisu |

(Continued)

OTHER PUBLICATIONS

Chen, Yiran, et al., "A Nondestructive Self-Reference Scheme for Spin-Transfer Torque Random Access Memory (STT-RAM)," 2010 EDAA. 6 pages.

(Continued)

*Primary Examiner* — Anthan Tran
(74) *Attorney, Agent, or Firm* — Holland & Hart LLP

(57) ABSTRACT

This disclosure relates to selectively performing a read with increased accuracy, such as a self-reference read, from a memory. In one aspect, data is read from memory cells, such as magnetoresistive random access memory (MRAM) cells, of a memory array. In response to detecting a condition associated with reading from the memory cells, a self-reference read can be performed from at least one of the memory cells. For instance, the condition can indicate that data read from the memory cells is uncorrectable via decoding of error correction codes (ECC). Selectively performing self-reference reads can reduce power consumption and/or latency associated with reading from the memory compared to always performing self-reference reads.

20 Claims, 2 Drawing Sheets

(56) References Cited

U.S. PATENT DOCUMENTS

| | | | |
|---|---|---|---|
| 7,765,426 B2* | 7/2010 | Li | G06F 11/073 |
| | | | 714/6.13 |
| 8,116,123 B2 | 2/2012 | Chen et al. | |
| 2005/0144551 A1 | 6/2005 | Nahas | |
| 2008/0120526 A1* | 5/2008 | Eguchi | G11C 16/28 |
| | | | 714/773 |
| 2010/0002501 A1 | 1/2010 | Leuschner et al. | |
| 2010/0067281 A1* | 3/2010 | Xi | G11C 11/16 |
| | | | 365/148 |
| 2010/0135072 A1* | 6/2010 | Reed | B82Y 25/00 |
| | | | 365/171 |
| 2010/0246244 A1 | 9/2010 | Shimomura et al. | |
| 2011/0080773 A1 | 4/2011 | El Baraji et al. | |
| 2011/0099458 A1 | 4/2011 | Reche et al. | |
| 2011/0122679 A1 | 5/2011 | Chen et al. | |
| 2012/0127787 A1 | 5/2012 | Chen et al. | |
| 2013/0128657 A1* | 5/2013 | Alam | G11C 11/1675 |
| | | | 365/158 |

OTHER PUBLICATIONS

International Search Report and Written Opinion of Jun. 16, 2014 from corresponding International Application No. PCT/US2014/019148 filed Feb. 27, 2014, 11 pages.

Sun et al., "Voltage Driven Nondestructive Self-Reference Sensing Scheme of Spin-Transfer Torque Memory," IEEE Transactions on Very Large Scale Integration (VLSI) Systems, Oct. 10, 2011, pp. 2020-2030, vol. 20, Issue 11, Nov. 2012, IEEE.

* cited by examiner

SELECTIVE READING OF MEMORY WITH IMPROVED ACCURACY

CROSS REFERENCE TO RELATED APPLICATION

This application is a divisional of U.S. patent application Ser. No. 13/804,598, filed Mar. 14, 2013, titled "SELECTIVE SELF-REFERENCE READ," the disclosure of which is hereby incorporated by reference in its entirety herein.

BACKGROUND

Technical Field

This disclosure generally relates to electronics, and, in particular, to memory devices.

Description of the Related Technology

Read errors can occur in various types of memories, such as magnetoresistive random access memories (MRAMs). MRAM is a form of non-volatile memory in which data can be stored by adjusting a resistance in a magnetic tunneling junction (MTJ) of a memory cell. For instance, the resistance of an MTJ can be switched between a high resistance state and a low resistance state. In an MRAM, a current induced magnetic field can switch the magnetization of the MTJ to switch between states.

Certain types of memories can encounter relatively high read error rates. Such error rates can be caused by several different sources or mechanisms or non-uniformities in the memories. Due to non-uniformities in manufacturing, different memory cells in the same memory array may not be matched with each other. For instance, in some MRAMs that store binary states, the variability in the memory cells can cause a relatively high variation in the distribution in resistance for both the low resistance states and high resistance states for memory cells in the same memory array. Some ways of reading from an MRAM, such as a self-reference read, can encounter fewer errors but consume higher power and can also increase the latency for accessing data from the memory.

Accordingly, a need exists for accurately and efficiently reading from memories, such as MRAMs.

BRIEF DESCRIPTION OF THE DRAWINGS

These drawings and the associated description herein are provided to illustrate specific embodiments of the invention and are not intended to be limiting.

To avoid repetition of description, components having the same or similar function may be referenced by the same reference number.

DETAILED DESCRIPTION OF CERTAIN EMBODIMENTS

Figure 1:
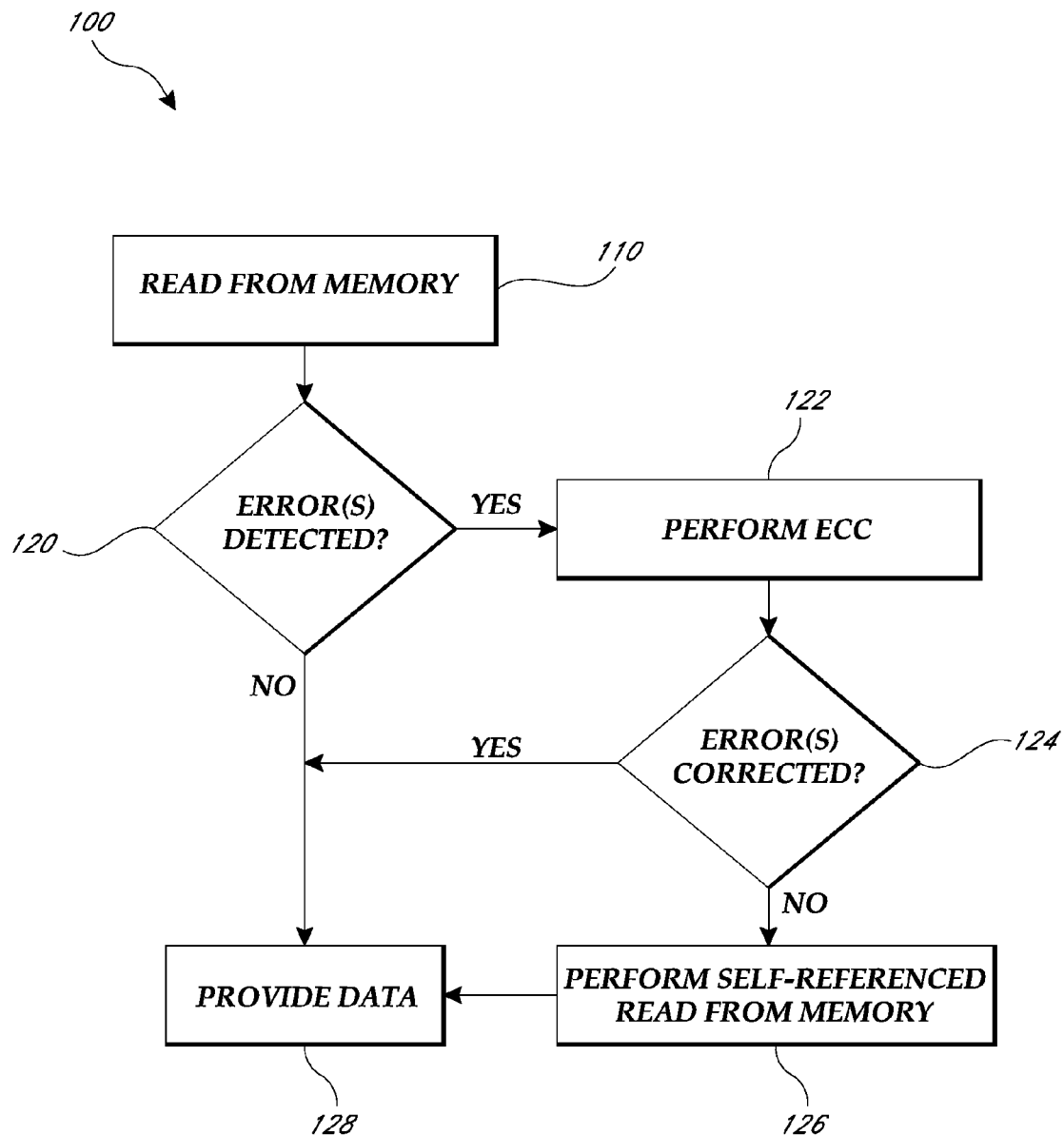
FIG. 1 is a flow diagram of an illustrative method of reading data from a memory according to an embodiment.

Although particular embodiments are described herein, other embodiments, including embodiments that do not provide all of the benefits and features set forth herein, will be apparent to those of ordinary skill in the art.

As discussed above, memories can encounter read errors. For instance, MRAM cells can have a relatively small difference between resistances in different states, such as a high resistance state and a low resistance state. Variations in MRAMs and other memories can contribute to relatively high read error rates. For example, some magnetic tunnel junction spin torque transfer magnetoresistive random access memory (MTJ STT-MRAM) cells in the same memory array can have a relatively high distribution of resistances in both low resistance states and high resistance states. In certain instances, there can be MTJ STT-MRAM cells that have a low state resistance that overlaps with the distribution of high resistance states of other cells in the same memory array. Alternatively or additionally, variations in an effective resistance in a signal path can cause read errors. Variations in an access transistor in a memory cell and/or variations in the digit line resistance can cause variation in effective resistance in the signal path. Read errors resulting from a variation in resistance of the signal path can even occur when the resistances of the MTJ cells in the same state are within a tight distribution.

While the disclosure may describe examples in connection with MRAMs for illustrative purposes, the principles and advantages described herein may be applied to other suitable types of memory. The principles and advantages described herein can be applied to any memory in which there is a variation in parasitic resistances in memory cells and/or signal paths that can result in a read error. For example, any combination of features described herein can be applied to any memory cells that include a memory element that has different resistances in different states, which can be detected when determining data read from such memory cells. Some examples of memory cells that have memory elements with different resistances in different states include MRAM cells including STT-MRAM cells and orthogonal spin transfer magnetoresistive random access memory (ST-MRAM) cells, resistive random-access memory (RRAM or ReRAM) cells including conductive bridging random access memory (CBRAM), ferroelectric random access memory (F-RAM) cells, complementary method oxide memory (CMOx) cells, phase change memory (PCM or PRAM) cells, and the like.

The state of an MRAM cell can be determined by comparing a value from a memory array to a reference value. The reference value may be obtained from a reference cell that is programmed to a state such that the reference cell returns a value between values associated with different states of a memory cell, such as a high resistance state and a low resistance state. Reading from a MRAM by comparing a value associated with a selected memory cell with a reference value can be referred to as a standard reference read. In certain instances, a single reference value may not be sufficient to accurately read from all of the memory cells, for example, due to the variations discussed above.

Another way to determine a state of an MRAM cell, such as an MTJ STT-MRAM cell is a self-reference read. Self-reference reads can reduce errors compared to standard reference reads. In a self-reference read, a memory cell is compared to itself. Self-reference reads can involve comparing a value read from a memory cell to another value read from the same memory cell. This can reduce and/or eliminate read errors that result from differences in cell-to-cell MTJ resistance and/or differences in resistances of signal paths associated with different cells in a memory array since the same cell and signal path are used in comparing memory cell resistance values. An example self-reference read can involve (1) performing a standard reference read from a memory cell, (2) programming the memory cell to a reference state, (3) reading the memory cell programmed at the reference state, and (4) comparing the values of the two separate reads from the memory cell with a differential sense amplifier. In this example, if the two values read from the memory cell are approximately the same, the memory cell is determined to be in the reference state. On the other hand, in this example, if the two values read from the memory cell are sufficiently different, the memory cell is in a non-reference state and the memory cell is subsequently re-written to the non-reference state.

Self-reference reads can increase latency and power compared to standard reference reads. The latency between when data is requested and returned can be increased with a self-reference read compared to a single read because the self-reference read can involve more than one read operation and an additional programming operation. The additional programming and reading associated with a self-reference read can significantly increase power consumption compared to a single read.

To accurately read from memory cells in a power efficient manner, self-reference reads can be selectively performed in one or more conditions in which read errors are suspected to have occurred and/or likely to occur. As such, a combination of standard reference reads and self-reference reads can be performed to accurately read data from a memory and maintain relatively low power consumption for reading from the memory. Furthermore, in some instances, the average latency of accessing data from the memory can be reduced compared to performing only self-reference reads.

FIG. 1 is a flow diagram of an illustrative method 100 of reading data from a memory according to an embodiment. In the method 100, data is read from a memory, such as an MRAM, with a combination of standard reference reads and self-reference reads. At block 110, data can be read from a memory. The read at block 110 can involve a standard reference read. Alternatively, data can be read in accordance with any other suitable low latency, low power method. Data can be read from a single memory cell or a plurality of memory cells, for example, to read a codeword or a byte of data. A codeword is a combination of data and its corresponding error correction codes (ECC). The data and the corresponding ECC do not need to be adjacent in a storage device. The memory device can include an ECC encoder/decoder to perform error correction code encoding and decoding.

More intensive reads, such as self-reference reads, that involve higher power consumption and/or a longer latency can be performed in response to detecting a condition. While self-reference reads are described for illustrative purposes, the principles and advantages described herein can be applied to selectively performing any read operation with increased accuracy compared to a standard read operation, such as a standard reference read. For instance, any combination of features described herein with reference to a self-reference read can be applied to any read operation that involves multiple reads from the same memory cell.

A condition for performing the self-reference read can be associated with the read at block 110. For example, it can be determined whether all error(s) in the read at block 110 are correctable via error correction codes (ECC). Examples of ECC include Hamming codes, Bose Chaudhuri Hocquenghem (BCH) codes, and the like. ECC bits can be used to detect bits that fail the read at block 110 and/or codewords that are uncorrectable via ECC.

In one embodiment, the process analyzes the data read from memory for the errors at decision block 120 and attempts to correct errors using ECC. If no errors are detected at decision block 120, the data read from memory at block 110 can be provided to a processor at block 128. When errors are detected at block 120, the process initially attempts to correct the errors using the ECC at block 122. The read data can be corrected via ECC on the same die and/or chip as the memory. Alternatively or additionally, ECC correction can be performed external to the die and/or chip on which the memory is included. However, when the number of errors is greater than the number of errors correctable by the ECC, the codeword is uncorrectable via ECC. At decision block 124, it is determined whether all errors are correctable by ECC.

Detecting uncorrectable ECC errors at block 124 is one illustrative example of detecting a condition for which self-reference reads are performed. Self-reference reads can be performed in response to detecting a condition associated with a read from a memory. For instance, a self-reference read can be performed in response to detecting a condition indicative of at least one suspected error in data read from a memory. As another example, a self-reference read can be performed in response to detecting a condition indicative of data being read from memory having at least a threshold number of errors. As yet another example, a self-reference read can be performed in response to detecting a condition indicative of one or more memory cells having a relatively large variation in resistance in the memory cell and/or the signal path associated with reading from the memory cell.

In some embodiments, a self-reference read is performed only in response to detecting a condition, such as one or more of the conditions described herein. For instance, according to one embodiment, self-reference reads are performed only in response to determining that data read from the memory is otherwise uncorrectable via ECC.

Referring back to FIG. 1, when it is determined at decision block 124 that all errors are corrected via ECC, the ECC corrected data can be provided to a processor at block 128. In this way, data read from memory that is correctable via ECC can be provided to the processor with a relatively low power consumption and/or a relatively low latency. Memory cells associated with failing data digits can be validated after the read at block 110 without causing delay in providing the read data to the processor. In one embodiment, there are more than one codeword in a data read. In some embodiments, ECC can be used to identify particular codewords having uncorrectable errors and perform a self-reference read on only the particular data digits and/or ECC digits of the identified codewords to validate the memory cells. Other suitable methods can be used to validate the memory cells.

When it is determined that errors in data read from memory are not correctable via ECC at decision block 124, a self-reference read can be performed at block 126. Similarly, the self-reference read can be performed at block 126 in response to detecting a number of conditions associated with a read, for example, one or more of the conditions described herein. In this way, some reads from the memory involve a single read operation and other reads from the memory involve a plurality of read operations when a condition is detected. The self-reference read can involve the operations described above in connection with the example self-reference read. Any other suitable self-reference read operations can alternatively or additionally be performed. By performing a self-reference read, correct data can be read from the memory when data previously read from the same memory cells encountered an error that is uncorrectable via ECC alone. The self-reference read can be performed on memory cells associated with each digit of a codeword associated with the uncorrectable ECC errors. In certain embodiments, one or more errors in data read from the self-reference read can be further detected and corrected as necessary via ECC. The data read from memory via a self-reference read at block 126 can be provided to a processor at block 128. Data can be provided to a processor at block 128 via a memory controller, for example.

A self-reference read typically involves a longer latency for providing valid data than a single read operation such as a standard reference read. A memory controller receiving data read from the memory can detect and account for such a delay. In certain embodiments, selectively performing self-reference reads can result in some or all of the other memory accesses to have a lower latency than the self-reference reads. This should reduce the average latency of memory accesses. By selectively performing a self-reference read, some or all of the other memory accesses can consume lower power than the self-reference read. Such a reduction in power savings can be significant. As self-reference reads should be less frequently performed, the reduction in power consumption and average latency also increases. When the self-reference read is performed when error correction via ECC fails, the underlying bit fail rate should be as good as if self-reference reads were performed on every memory access.

In certain embodiments, the process 100 can provide data read from memory with a variable latency. The data provided by a standard reference read can be provided with a lower latency than data read by a self-reference read. A data ready signal can be provided to a memory controller as an indication of valid read data being ready for further processing. A dedicated pin can be included on the memory controller to receive the data ready signal in one embodiment. Additional circuitry can be included to determine when valid read data is ready for further processing, for example, in a managed memory solution. In this way, a dedicated pin may not be needed for the data ready signal. In some embodiments, the additional circuitry can implement a variable latency read in connection with a double data rate type 3 (DDR3) memory controller. With a variable latency read, a memory can provide valid data with lower power and lower average latency by selectively performing self-reference reads compared to only performing self-reference reads. In certain embodiments, most reads in such a method can provide valid read data with lower latency than self-reference reads.

According to some embodiments, data read from memory can be provided with a fixed latency. In such embodiments, the data read by a standard read can be provided to a memory controller with approximately the same latency as a self-reference read. Using approximately the same latency for all read accesses can simplify the design of a memory controller. With a fixed latency for reading data from memory, selectively performing self-reference reads should consume lower power than only performing self-reference reads.

The methods of selectively performing a self-reference read herein can be implemented a variety of ways in hardware and/or firmware. For instance, selectively performing self-reference reads can be implemented in a context of memory cells that are read with relatively low swing signals. The principles and advantages described herein can be applied to memories with variations in resistance among memory cells in the same memory array and/or with variations in resistance in signal paths among memory cells in the same memory array. High density MRAM is one example of such a memory. MRAMs can be highly scalable, high density, have relatively low power consumption, have relatively low latency for programming and reading, and have high endurance.

Figure 2:
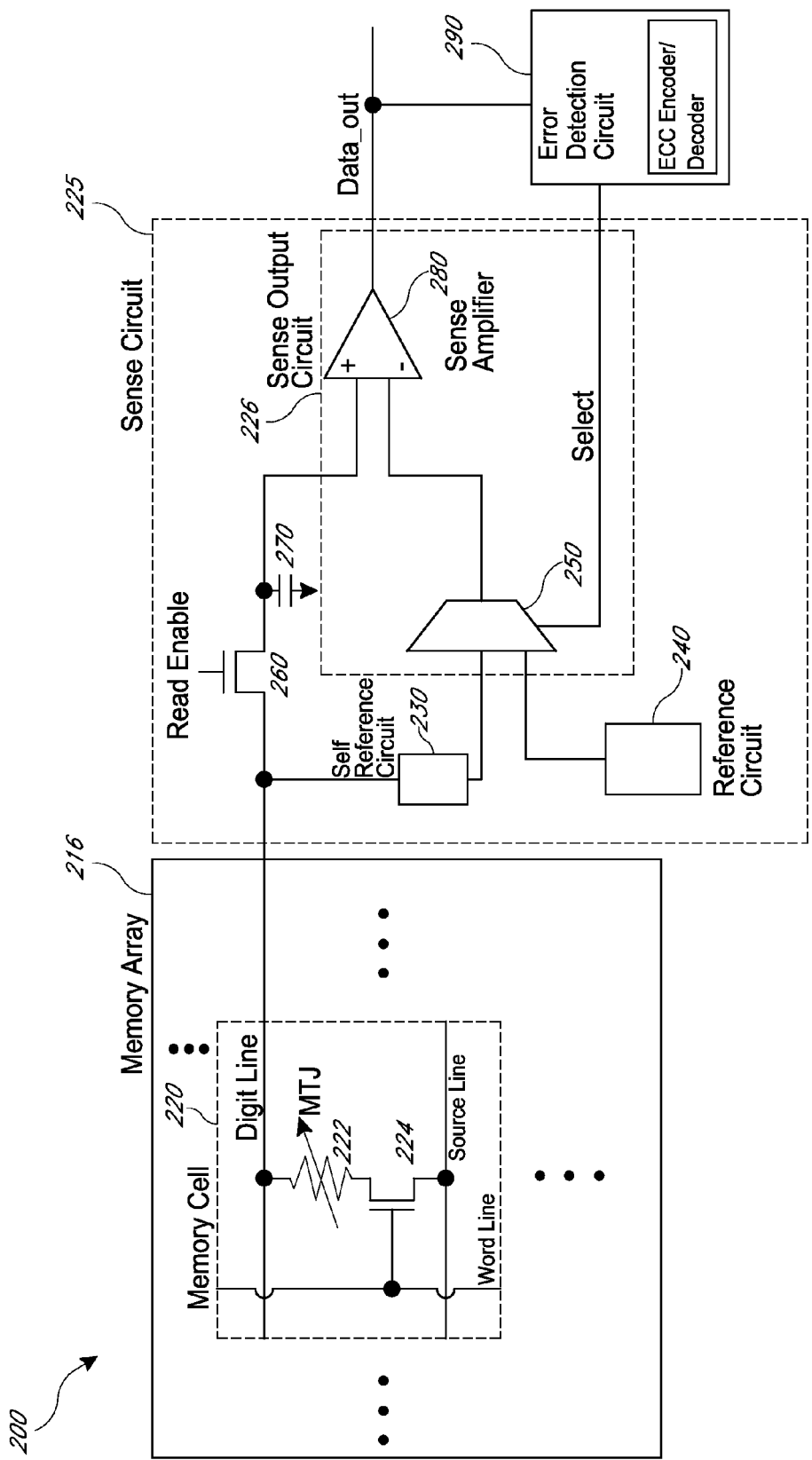
FIG. 2 is a schematic diagram of an illustrative memory according to an embodiment.

FIG. 2 is a schematic diagram of an example memory 200 according to an embodiment. As illustrated in FIG. 2, the memory 200 can include a memory array 216 and a sense circuit 225 to sense a value read from a memory cell 220 in the memory array 216. The memory 200 can also include an error detection circuit 290, which can detect errors associated with data read from the memory array 216 and/or any of the conditions described herein. The error detection circuit 290 can include an ECC encoder/decoder. The memory 200 can include fewer or more components than illustrated. The memory 200 can implement any combination of features describe in reference to the method 100.

The memory array 216 includes a plurality of memory cells 220. The memory cells 220 can store data digits, such as bits of a codeword that includes data and corresponding error correction codes. The memory cells 220 can store binary data digits in one embodiment. In another embodiment, the memory cells 220 can store multi-level data digits that correspond to three or more different states of a particular memory cell 220.

The illustrated memory cell 220 is a MTJ STT-MRAM cell. The illustrated memory cell 220 includes a spin-transfer torque (STT) MTJ memory element 222 that is electrically connected in series with an access transistor 224. The access transistor 224 can be a field effect transistor (FET), such as an NMOS transistor or more generally, an insulated gate FET. It will be understood that these FETs can have gates made out of materials other than metals, such as polycrystalline silicon, and can have dielectric "oxide" regions made from dielectrics other than silicon oxide, such as from silicon nitride or high-k dielectrics. A first end of the STT MTJ memory element 222 can be electrically connected to a drain of the transistor 224. A second end of the STT MTJ memory element 222 can be electrically connected to a digit line. The access transistor 224 can also have a source electrically coupled to a source line and a gate electrically coupled to a word line. The STT MTJ memory element 222 can be modeled as a variable resistor. Changing a state of the STT MTJ memory element 222 via spin transfer can occur when a current passing through a magnetic layer of the STT MTJ memory element 222 becomes spin polarized and imparts a spin torque on a free layer of the STT MTJ memory element 222. When a sufficient spin torque is applied to the free layer, the magnetization orientation of the free layer can be switched between two opposite directions. Depending on the direction of the current, the STT MTJ memory element 222 can be switched between a low resistance state and a high resistance state.

MRAMs can encounter difficulties in reading data due to variations in resistance. For example, in the memory 200, the variation of resistances between MTJ memory elements 222 of different memory cells 220 can cause difficulties in accurately determining data stored in the memory cells 220. Alternatively or additionally, the variation in resistance between access transistors 224 of different memory cells 220 and/or variation in parasitic resistances between digit lines associate with different memory cells 220 can cause difficulties in accurately determining data stored in the memory cells 220. The sense circuit 225 can efficiently and reliably determine valid data digits read from memory cells 220 of the memory array 216 in the presence of one of more of these variations in resistance.

A stored data digit can be read out of a memory cell 220 by measuring a resistance of the memory cell 220. An example signal path is shown in FIG. 2 for one memory cell 220. A value read from the memory cell 220 can be provided to the sense circuit 225. As illustrated, the sense circuit 225 includes a sense output circuit 226, a self-reference circuit 230, a reference circuit 240, a pass transistor 260, and a storage element 270. While the sense circuit 225 is illustrated for one digit line in FIG. 2, the sense circuit 225 can include a dedicated sense output circuit 226, self-reference circuit 230, pass transistor 260, and storage element 270. In certain embodiments, any combination of the sense output circuit 226, the self-reference circuit 230, the pass transistor 260, and storage element 270 can be provided in connection with each digit line in the memory array 216.

The sense circuit 225 can operate in a first mode and a second mode. In one embodiment, the second mode can be activated only when errors in a codeword are determined to be uncorrectable. The sense output circuit 226 can compare a value read from a selected memory cell of the memory array associated with a first read operation with a reference signal in the first mode, or compare a value read from the selected memory cell of the memory array associated with a second read operation with a self-reference value in the second mode, based on a select signal. The select signal can be indicative of any combination of the conditions associated with reading from a memory described herein. For instance, the select signal can be indicative of an error in data read from the memory being uncorrectable via ECC.

With reference to FIG. 2, a value read from the memory cell 220 can be provided via a pass transistor 260 to a storage element 270, such as a capacitor. The pass transistor 260 can pass the value read from the memory cell 220 to the storage element 270 when a read enable signal is asserted. The value stored by the capacitor can be provided to an input of a sense amplifier 280.

The value read from the memory cell 220 can also be provided to a self-reference circuit 230. The self-reference circuit 230 can store a value read from the memory cell 220 for a comparison with a subsequent value read from the memory cell. The self-reference circuit 230 can provide a self-reference value to a sense output circuit 226 during a subsequent read operation from the memory cell 220. The self-reference value can represent a value previously read from the memory cell 220.

A reference circuit 240 can provide a reference value to the sense output circuit 226. The reference circuit 240 can be any suitable circuit configured to provide a reference value for determining a state of a memory cell 220. As one example, the reference circuit 240 can include a reference memory cell functionally similar to the memory cell 220. Such a reference cell can be configured to generate a high state value, a low state value, or a value between the high state and the low state. In one embodiment, one reference circuit 240 can be implemented with the memory array 216 and one self-reference circuit 230 can be implemented with each digit line of the memory array 216. The reference value can then be used to determine a value of a data digit stored in the memory cell 220 in a standard reference read.

In certain embodiments, the sense output circuit 226 includes a multiplexer 250 and a sense amplifier 280. The multiplexer 250 can receive the reference signal and the self-reference signal. The multiplexer 250 can be implemented by any suitable circuit, such as combinational logic and/or switch(es). The multiplexer 250 can output either the reference value or the self-reference value based on a select signal. The select signal can be indicative one or more of the conditions described herein, for example, whether an error uncorrectable via ECC has been detected. An output of the multiplexer 250 can be provided to the sense amplifier 280. In this way, the multiplexer 250 can selectively provide the reference value to the sense amplifier 280 for a standard reference read or the self-reference value to the sense amplifier 280 for a self-reference read.

The sense amplifier 280 can determine a data digit Data_Out based on comparing a value read from the memory cell 220 with either the reference value or the self-reference value. The data digit Data_Out can be output from the memory 200. For instance, the data digit Data_Out can be provided to an ECC engine in connection with a standard reference read. The ECC engine can be implemented on the same die as the memory 200 and/or external to a die that includes the memory 200. The ECC engine can include an error correction encoder/decoder configured to generate error correction codes, to identify errors in codewords, and to correct errors in codewords. In the embodiment shown in FIG. 2, the ECC engine is included in the error detection circuit 290.

In another embodiment (not illustrated), the sense output circuit 226 can include separate sense amplifiers for a standard reference read and a self-reference read. The separate sense amplifiers can be separately activated based on one or more of the conditions described herein. Alternatively or additionally, the outputs of the separate amplifiers can be provided to additional circuitry to determine which output of the sense amplifiers to output as the data digit.

The error detection circuit 290 can include logic to generate a data ready signal, which can be provided to a memory controller to indicate whether valid data read from the memory is ready to for further processing. The logic can be implemented by any suitable circuitry. Alternatively, the data ready signal can be generated by the sense circuit 225. The data ready signal can be used to implement variable latency reads from the memory array 216 in which a standard read has a lower latency than a self-referenced read.

In one embodiment, a method of reading data from a memory array includes reading data from memory cells of the memory array. The method also includes performing a self-reference read from the same memory cells in response to determining that an error in the data read from the memory cells is uncorrectable via error correction codes. The self-reference read includes comparing a value read from a memory cell to another value read from the same memory cell.

In another embodiment, a method of reading data from a memory array includes reading data from memory cells of the memory array by comparing values associated with the memory cells of the memory array with a reference value. The method also includes performing a self-reference read from at least one of the memory cells in response to detecting a condition associated with the reading data from the memory array. The self-reference read includes comparing a value read from a memory cell to another value read from the same memory cell.

In another embodiment, an apparatus includes a memory array, an error correction encoder/decoder, and a sense circuit. The memory array includes memory cells and is configured to store codewords that include data and corresponding error correction codes. The error correction encoder/decoder is configured to generate error correction codes, to identify errors in codewords, and to correct errors in codewords. The sense circuit has a first mode and a second mode. The second mode is activated only when errors in a codeword are determined to be uncorrectable. The sense circuit includes a reference circuit, a self-reference circuit, and a sense output circuit. The reference circuit is configured to generate a reference signal for the first mode. The self-reference circuit is configured to receive a value read from a selected memory cell of the memory array associated with a first read operation, and to generate a self-reference signal based on the received value for the second mode. The sense output circuit is configured to perform a first comparison of the value read from the selected memory cell of the memory array associated with the first read operation with the reference signal. The sense output circuit is also configured to perform a second comparison of the a value read from the selected memory cell of the memory array associated with a second read operation with the self-reference value, the second read operation occurring subsequent to the first read operation. The sense circuit is also configured to output a data digit based on a select signal and at least one of the first comparison or the second comparison. The data digit represents data stored in the selected memory cell.

In another embodiment, a method of reading data from a memory array includes performing a standard reference read operation that includes reading data from selected memory cells of the memory array by comparing values associated with the selected memory cells of the memory array with at least one reference value. Each of the selected memory cells includes a memory element configured to have a different resistance in a first state than in a second state. The method also includes performing a read operation with increased accuracy compared to the standard reference read operation to read data from one or more of the selected memory cells, in response to detecting a condition associated with performing the standard reference read operation.

Self-reference reads can be selectively performed by a variety of memories in accordance with the principles and advantages described herein. A memory device, such as an MRAM device, according to the embodiments described above can be incorporated in various electronic devices. Examples of the electronic devices can include, but are not limited to, consumer electronic products, electronic circuits, electronic circuit components, parts of the consumer electronic products, electronic test equipments, etc. Examples of the consumer electronic products include, but are not limited to, a mobile phone, a telephone, a television, a computer monitor, a computer, a hand-held computer, a laptop computer, a tablet computer, a personal digital assistant (PDA), a microwave, a refrigerator, a stereo system, a cassette recorder or player, a DVD player, a CD player, a VCR, an MP3 player, a radio, a camcorder, an optical camera, a digital camera, a washer, a dryer, a washer/dryer, a copier, a facsimile machine, a scanner, a multi functional peripheral device, a wrist watch, a clock, etc. Further, the electronic device can include unfinished products.

The foregoing description and claims may refer to elements or features as being "connected" or "coupled" together. As used herein, unless expressly stated to the contrary, "connected" means that one element/feature is directly or indirectly connected to another element/feature, and not necessarily mechanically. Likewise, unless expressly stated to the contrary, "coupled" means that one element/feature is directly or indirectly coupled to another element/feature, and not necessarily mechanically. Thus, although the drawings illustrate various examples of arrangements of elements and components, additional intervening elements, devices, features, or components may be present in an actual embodiment.

Any combination of the features of the methods described herein may be embodied in code stored in a non-transitory computer readable medium. When executed, the non-transitory computer readable medium may cause some or all of any of the methods described herein to be performed. It will be understood that any of the methods discussed herein may include greater or fewer operations and that the operations may be performed in any order, as appropriate.

Various embodiments have been described above. Although described with reference to these specific embodiments, the descriptions are intended to be illustrative and are not intended to be limiting. Various modifications and applications may occur to those skilled in the art.

We claim:

1. A method of reading data from a memory array, the method comprising:
performing a first read operation comprising reading data from selected memory cells of the memory array and comparing values associated with the selected memory cells of the memory array with at least one reference value from a first source, wherein the first read operation has a first latency, and wherein each of the selected memory cells comprises a memory element configured to have a different resistance in a first state than in a second state;
in response to detecting a condition associated with performing the first read operation, performing a second read operation comprising reading data from the selected memory cells and comparing values associated with the selected memory cells with at least one reference value from a second source different from the first source, wherein the second read operation has increased accuracy compared to the first read operation and a second latency longer than the first latency; and
sending, after each of the first read operation and the second read operation, data read from the selected memory cells to a memory controller, the sending having a fixed latency with a duration greater than or equal to the second latency.

2. The method of claim 1, wherein the second read operation comprises two or more reads from the same memory cell of the selected memory cells.

3. The method of claim 1, wherein the second read operation involves a higher power consumption compared to the first read operation.

4. The method of claim 1, wherein the second read operation comprises a self-reference read, wherein the self-reference read comprises comparing a value read from a memory cell to another value read from the same memory cell.

5. The method of claim 1, wherein the condition is indicative of an error in the data read from the memory cells in the first read operation being uncorrectable via error correction codes.

6. The method of claim 1, wherein the memory array comprises magnetoresistive random access memory (MRAM) cells.

7. The method of claim 1, wherein the condition is indicative of a number of errors in the data read from the selected memory cells in the first read operation having at least a threshold number of errors, and wherein the threshold number of errors is greater than 1.

8. The method of claim 1, further comprising accessing, by a processor, data from the one or more of the selected memory cells with a variable latency, wherein the data accessed by performing the first read operation has a lower latency than the data accessed by performing the second read operation.

9. A method of reading data from a memory array, the method comprising:
performing a first read operation to read data from selected memory cells of the memory array, the first read operation having a first latency;

determining, using error correction codes, that an error in the data read from the selected memory cells is uncorrectable using error correction codes;

performing a second read operation, based at least in part on the determination, with increased accuracy compared to the first read operation to read the data from one or more of the selected memory cells of the memory array, the second read operation having a second latency longer than the first latency; and sending, after each of the first read operation and the second read operation, data read from the selected memory cells to a memory controller, the sending having a fixed latency that is greater than or equal to the second latency.

10. The method of claim 9, further comprising accessing, by a processor, data from the memory array with a variable latency, wherein data accessed by performing the first read operation has a lower latency than data accessed by performing the second read operation.

11. The method of claim 9, further comprising correcting correctable errors in the data read from the selected memory cells via decoding of error correction codes.

12. The method of claim 9, wherein performing the first read operation comprises reading data from the selected memory cells of the memory array by comparing values associated with the selected memory cells with at least one reference value.

13. The method of claim 9, wherein performing the second read operation comprises performing two or more reads from the one or more of the selected memory cells of the memory array.

14. The method of claim 9, wherein the selected memory cells comprise magnetoresistive random access memory (MRAM) cells.

15. A method of reading data from a memory array, the method comprising:

performing a first read operation of a first type to read data from a selected memory cell of the memory array, wherein the first read operation has a first latency;

in response to detecting a condition associated with performing the first read operation, performing a second read operation of a second type to read data from the selected memory cell of the memory array, the second type being different from the first type and having increased accuracy compared to the first read operation and a second latency longer than the first latency; and sending, after each of the first read operation and the second read operation, data read from the memory array to a memory controller, the sending having a fixed latency that is greater than or equal to the second latency.

16. The method of claim 15, wherein the condition is indicative of a number of errors in the data read from the memory array with the first read operation having at least a threshold number of errors.

17. The method of claim 15, wherein the second read operation involves a higher power consumption relative to the first read operation.

18. The method of claim 15, wherein the second read operation comprises performing two or more reads from the selected memory cell.

19. The method of claim 15, wherein the selected memory cell comprises a memory element configured to have a different resistance in a first state than in a second state.

20. The method of claim 15, wherein the memory array comprises magnetoresistive random access memory (MRAM) cells.

* * * * *